United States Patent [19]

Stopa et al.

[11] Patent Number: 5,016,139
[45] Date of Patent: May 14, 1991

[54] ELECTRONIC POWER SUPPLY WITH ENHANCED HEAT TRANSFER CHARACTERISTICS

[75] Inventors: James L. Stopa, Old Saybrook; Stephen C. Bibbiani, Westbrook, both of Conn.

[73] Assignee: Whelen Technologies, Inc., Chester, Conn.

[21] Appl. No.: 403,599

[22] Filed: Sep. 6, 1989

[51] Int. Cl.$^5$ ............................................. H05K 7/20
[52] U.S. Cl. ................... 361/386; 307/150; 361/395; 361/419; 363/141
[58] Field of Search ............... 363/140, 141; 307/150, 307/151; 315/241 R; 361/380–383, 386–388, 395–400, 405, 417, 419, 420, 534–541

[56] References Cited

U.S. PATENT DOCUMENTS

| | | | |
|---|---|---|---|
| 4,013,921 | 3/1977 | Corthell | 315/241 R |
| 4,039,900 | 8/1977 | Roback | 363/141 |
| 4,292,665 | 9/1981 | Hersom | 363/141 |
| 4,321,507 | 3/1982 | Bosnak | 315/241 R |
| 4,330,812 | 5/1982 | Token | 361/387 |
| 4,719,540 | 1/1988 | George | 361/386 |
| 4,796,156 | 1/1989 | Webster | 361/386 |
| 4,914,551 | 4/1990 | Anschel | 361/386 |

*Primary Examiner*—Gerald P. Tolin
*Attorney, Agent, or Firm*—Chilton, Alix & Van Kirk

[57] ABSTRACT

An electronic power supply which employs energy storage capacitors has an enclosure defining a housing including a base and a cover. The capacitors are resiliently supported within the enclosure on a carrier. Integral receivers extend from the underside of the top of the cover in registration with the carrier and engage the capacitors to clamp the capacitors in a fixed position within the housing. The housing exterior includes a thermal radiator consisting of multiple fins which extend outwardly from the receivers for dissipating heat generated in the capacitors.

19 Claims, 2 Drawing Sheets

ELECTRONIC POWER SUPPLY WITH ENHANCED HEAT TRANSFER CHARACTERISTICS

BACKGROUND OF THE INVENTION

This invention relates generally to electronic apparatus circuits and particularly to housings for power supplies. More specifically, the present invention is directed to enhancing the longevity and efficiency of high power electronic circuits by transferring heat away from components of such circuits. Accordingly, the general objects of the invention are to provide novel and improved apparatus and methods of such character.

While not limited thereto in its utility, the present invention has particular utility in electronic systems which supply power to intermittently operated loads and especially to high intensity light generator loads. In warning light systems employed on emergency vehicles, it is common to employ gaseous discharge devices, such as xenon flash tubes, for generating intense intermittent bursts of radiation in the visible spectrum. A number of electronic power supplies are commercially available for use in the energization of gas discharge tubes for such warning light systems. For example, U.S. Pat. Nos. 4,013,921 and 4,321,507 generally disclose power supply circuitry of the type for which the present invention has applicability. These power supplies employ one or more relatively large electolytic capacitors which are discharged through the flash tube(s) to provide the power for generating the requisite light output, these capacitor(s) being repetitively charged and discharged during light system operation. Because of the power dissipated, the temperature of these capacitors increases and, of course, electronic circuit components are subject to accelerated aging and thus premature failure if operated at high temperatures, and particularly if allowed to exceed their rated temperatures.

Typically, power supply circuitry is housed in an enclosure which is at least in part defined by a metal or plastic box. The capacitors which supply power to the flash tube(s) occupy substantial space within the enclosure and, as noted above, generate a significant quantity of heat during the operation of the power supply. The bulky nature of the capacitors and the significant heat generated by the capacitors has presented problems in terms of positioning and mounting the capacitors within the enclosure and for transferring the heat from the vicinity of the capacitors to prevent overheating which could damage or effect the operation of the power supply.

SUMMARY OF THE INVENTION

Briefly stated, the invention in a preferred form is an electronic power supply. The power supply consists of a housing fabricated from a material having good heat transfer characteristics and electronic circuitry comprising at least one capacitor, having a generally cylindrical shape, for intermittently providing power to a load. A capacitor holder or cradle is supported above the base of the housing for resiliently capturing a capacitor. The cradle includes a concave shaped support surface which is generally complementary with the shape of a portion of the capacitor. The housing comprises a top portion having an interiorly projecting capacitor receiver. The receiver has an inwardly facing surface contour which is shaped and dimensioned for surface-to-surface contact against the capacitor so that the capacitor may be clamped in a fixed position between the cradle and the receiver.

The housing has an exterior recessed portion which generally aligns with the capacitor receiver. The housing further includes a plurality of fins which integrally extend from the recessed portion, the recessed portion thus being defined by segments of a cylindrical surface. The fins are generally parallel. In one embodiment, the cradle included two beds for receiving a pair of capacitors and the housing had a pair of matching receivers. A layer of compressible material is disposed between the capacitor(s) and the cradle(s). This material is compressed when the power supply is assembled to accommodate dimensional variations in the housing and in the capacitors, to absorb vibration and, most importantly, to urge the capacitors against the facing surfaces of the receivers to insure a good heat transfer relationship.

An object of the invention is to provide a new and improved power supply.

Another object of the invention is to provide a new and improved power supply which includes a housing which provides an efficient and effective means for dissipating heat generated during operation of the power supply.

A further object of the invention is to provide a new and improved power supply having an efficient means for locating and securely mounting capacitors within the housing of the power supply.

Other objects and advantages of the invention will become apparent from the drawings and the specification.

DETAILED DESCRIPTION OF THE INVENTION

Figure 1:
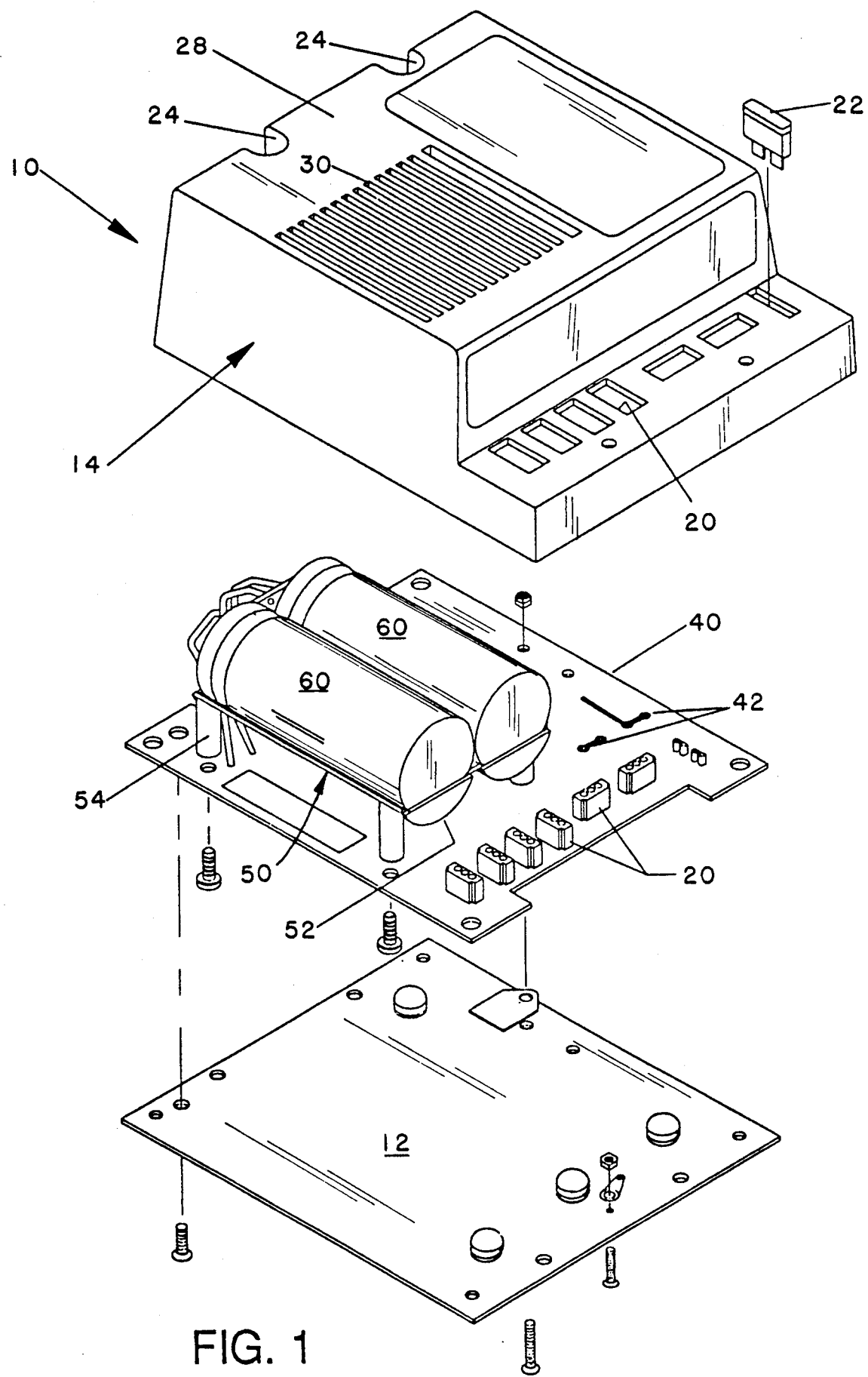
FIG. 1 is an exploded view, partly in schematic, of a power supply in accordance with the present invention.
Figure 2:
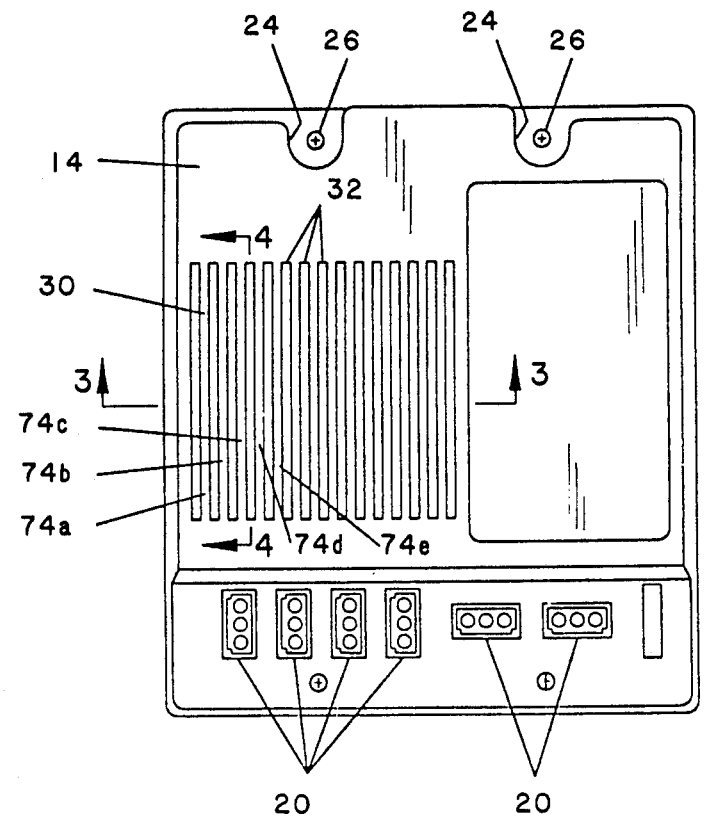
FIG. 2 is a top plan view of the power supply of FIG. 1.

With reference to the drawings, wherein like numerals represent like parts throughout the Figures, a power supply in accordance with the present invention is generally designated by the numeral 10. While not limited in its utility or its application, power supply 10 may be employed to provide current to an intermittently energized load such as a gas discharge tube employed as a strobe light and particularly an emergency warning light. The power supply 10 generally comprises a base 12 and a cover 14 which mounts to the base, the base and cover defining the power supply housing.

The cover 14 has a generally contoured rectilinear shape with a reduced offset portion having a plurality of rectangular openings through which project electrical connectors 20. A fuse 22 may also be mounted for exterior projection at one of the openings. The sides of the cover 14 are generally planar with the rear portion defining sockets 24 for threaded fasteners 26. The upper top surface 28 of the cover 14 comprises a thermal radiator 30 which will be described hereinafter.

A circuit board 40 for the electronic circuitry of the power supply is mounted interiorly of the housing. The circuit board 40 supports various components of the power supply circuit, a portion of a prototypical circuit being designated generally by the numeral 42. It will be understood that the circuit 42 may comprise the circuit depicted in U.S. Pat. No. 4,321,507. Circuit 42 includes at least one capacitor 60 but may have numerous configurations which do not limit the scope of the invention.

In the disclosed embodiment, a capacitor cradle, indicated generally at 50, comprise tandem capacitor beds 52 which are supported by legs 54. The legs rest on the circuit board 40 and are secured thereto. The capacitor beds 52 have an arcuate contour or trough-shaped configuration as shown which generally complements the cylindrical shape of capacitors 60. The capacitors 60 will typically comprise high voltage rated electrolytic capacitors. Such capacitors are frequently employed in power supply circuits of the type to which the present invention has particular applicability.

A pad of resilient material 56, which may be an open celled foam or any other suitable sheet material having the requisite resiliency and temperature degradation resistance, is positioned on the capacitor beds 52. The resilient material 56 functions to compensate for manufacturing tolerances and to insure the establishment of intimate contact between the capacitors and the interior heat transfer surfaces of the cover 14. During initial installation, the capacitors are positioned on the beds 52 with the capacitor leads being connected to the circuitry on board 40 in a conventional fashion.

The cover 14 is fabricated from a material having a high coefficient of thermal conductivity. In the disclosed embodiment the cover has a cast metal composition such as, for example, aluminum. A pair of capacitor receivers 70 project integrally downwardly from the underside of the housing cover. The receivers 70 align with the beds 52 when the cover is mounted to the base. The surfaces of the capacitor receivers 70 which face inwardly have a concave arcuate shape which generally conforms to the cylindrical contour of the capacitors and is dimensioned to be generally commensurate therewith. In preferred form, the receivers have an inverted cylindrical surface portion.

When the cover 14 is mounted to the base 12, the receivers 70 engage the capacitors and force the capacitors downwardly to compress the foam material 56. When the cover is secured in position, a surface-to-surface interface is established between the capacitors and receivers and this interface encompasses a significant surface area of the capacitors. The capacitors are rigidly clamped in position within the housing between the receivers 70 and the cradles 50.

Figure 3:
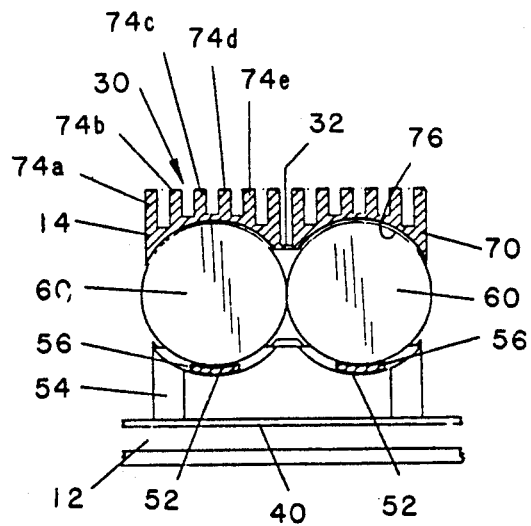
FIG. 3 is a fragmentary sectional view of the assembled power supply taken along line 3—3 of FIG. 2.
Figure 4:
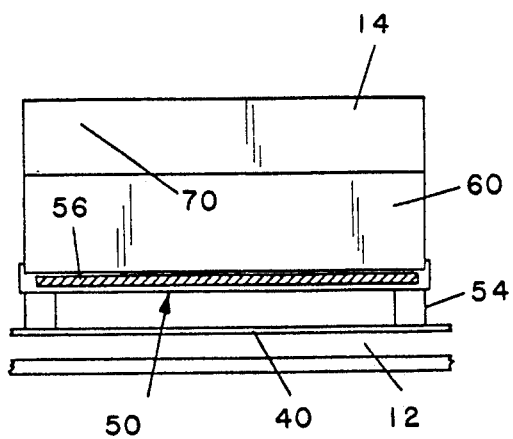
FIG. 4 is a fragmentary sectional view of the power supply taken along the line 4—4 of FIG. 2.

At the outer exterior surface of the housing, the rectangular grill 30 defines recessed segmental surface 32 with a general exterior contour having a shape which is complementary to the capacitor engaging surfaces of the receivers 70 as best illustrated in FIG. 3. A plurality of longitudinally extending ribs or fins 74a, 74b, 74c . . . project from the recessed surface 32 to the plane defined by the top surface of the cover. It should be appreciated that the fins 74a, 74b, 74c . . . have different heights due to variations in the corresponding projection distances from the cylindrical surface 32. The fins 74 are in intimate thermal communication with the capacitors 60 due to the engagement of the capacitors 60 by the receivers 70. The heat transfer efficiency of the thermal circuit comprising the receivers and fins will typically be maximized by coating the faces of the receivers which face the capacitors with a deformable layer 76 of a material which has a high coefficient of thermal conductivity. This material may, for example, comprise a thermally conductive silicone grease or a silicone sheet material. Consequently, during the operation of the power supply, the heat generated in the capacitors will be very efficiently transferred through the receivers to the fins for dissipation to the ambient atmosphere.

It should be appreciated that one, two or several such capacitor cradles 50 and associated receivers 70 may be provided to fixably mount the capacitors within the housing and to provide a means for efficiently transferring heat from the capacitors to the ambient atmosphere via the housing. The foam-like material 56 essentially functions as a retention spring and also as a compensation element so that the capacitors may be securely clamped in fixed position without requiring close tolerances between the housing components or the mounting structures for the capacitors and without damaging the capacitors.

Naturally, the invention has applicability to a wide variety of circuits and electronic controls. In its preferred application, the power supply housing provides a very efficient means for both mounting the circuit capacitors in a fixed position within the enclosure and for facilitating rapid heat distribution and dissipation from the power supply capacitors.

While a preferred embodiment of the foregoing invention has been set forth for purposes of illustration, the foregoing description should not be deemed a limitation of the invention herein. Accordingly, various modifications, adaptations and alternatives may occur to one skilled in the art without departing from the spirit and the scope of the present invention.

What is claimed is:

1. A power supply with enhanced heat transfer characteristics comprising:

base means;

circuit means comprising a circuit board and including at least one capacitor having an exterior surface which is generally of cylindrical shape;

capacitor cradle means supporting said at least one capacitor, said cradle means comprising a bed having a concave-shaped surface generally complementary in shape to a portion of the exterior surface of said at least one capacitor, said cradle means being mounted on said circuit means;

cover means mounted to said base means and cooperating with said base means to enclose said circuit means and said cradle means, said cover means comprising a top portion having an interiorly projecting capacitor receiver, said receiver having a surface contour which is in part generally complementary in shape to said capacitor exterior surface, said receiver being in surface-to-surface contact with said at least one capacitor whereby said at least one capacitor is clamped in a fixed position between said capacitor cradle means and said receiver and is in intimate heat transfer relationship with said receiver.

2. The power supply of claim 1 wherein said cover means has an exterior segmental recessed portion, said recessed portion being generally in alignment with said receiver.

3. The power supply of claim 2 further comprising heat dissipator means comprising a plurality of fins extending from said cover means at said recessed portion.

4. The power supply of claim 3 wherein said recessed portion is defined by segments of a cylindrical surface.

5. The power supply of claim 4 wherein said fins are generally parallel.

6. The power supply of claim 1 wherein there are two capacitors.

7. The power supply of claim 1 further comprising a pad of compressible material disposed between said at least one capacitor and said cradle.

8. The power supply of claim 7 wherein said pad is compressed by said cover means being mounted to said base means.

9. The power supply of claim 5 further comprising a pad of compressible material disposed between said at least one capacitor and said cradle.

10. The power supply of claim 9 wherein said pad is compressed with said cover means being mounted to said base means.

11. The power supply of claim 10 wherein said cover means is comprised of a metal having a high coefficient of thermal conductivity and wherein said power supply further comprises a layer of a compressible material having a high coefficient of thermal conductivity disposed between said at least one capacitor and said receiver.

12. A power supply with enhanced heat dissipation characteristics comprising:
    circuit means, said circuit means including at least one electrolytic capacitor and a circuit board;
    base means;
    means supporting said circuit board on said base means;
    cradle means holding said at least one capacitor;
    means mounting said cradle means on said circuit board; and
    cover means mounted to said base means to define an enclosure which contains said circuit means, said cover means including a top portion having an interiorly projecting capacitor receiver positioned in registration with said cradle means, said receiver having a surface region which is complementary in shape to a portion of said at least one capacitor whereby said at least one capacitor is clamped in fixed position between said cradle means and said receiver and a surface region of said capacitor is in heat transfer contact with said receiver.

13. The power supply of claim 12 wherein said cradle means and said receiver each have surface portions configured to be generally complementary to the shape of a portion of said at least one capacitor.

14. The power supply of claim 13 further comprising a pad of compressible material interposed between said at least one capacitor and said cradle means.

15. The power supply of claim 14 wherein said cover means further comprises a plurality of heat transfer fins, said fins being in thermal communication with said receiver.

16. The power supply of claim 15 further comprising a layer of material having a high coefficient of thermal conductivity disposed between said at least one capacitor and said receiver.

17. A housing including an electronic power supply, the power supply including a circuit having at least one electrolytic capacitor, said housing comprising:
    base means mounting at least a portion of the power supply circuit;
    a cover mounted to said base means, said cover including a top portion having an interiorly projecting capacitor receiver and heat transfer means for dissipating heat transferred to said receiver from said at least one capacitor, said receiver having a concave-shaped surface generally complementary with the shape of a portion of said at least one capacitor, said base means and cover cooperating to define an enclosure for the power supply; and
    capacitor carrier means supported on said base means and holding said at least one capacitor, said carrier means comprising a bed having a concave-shaped surface generally complementary with the shape of a portion of said at least one capacitor, said capacitor carrier means and said receiver cooperating to clamp said at least one capacitor in an intimate heat transfer relationship with said receiver.

18. The housing of claim 17 wherein said cover is comprised of metal and said heat transfer means comprises a plurality of fins integrally formed in said cover means.

19. The housing of claim 18 wherein said fins are adjacent said receiver.

* * * * *